United States Patent
McCorkle et al.

(10) Patent No.: US 7,409,198 B2
(45) Date of Patent: Aug. 5, 2008

(54) WIDEBAND VARIABLE GAIN AMPLIFIER IN AN ULTRA WIDEBAND RECEIVER

(75) Inventors: John W. McCorkle, Vienna, VA (US); Phuong T. Huynh, Annandale, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 462 days.

(21) Appl. No.: 11/214,061

(22) Filed: Aug. 30, 2005

(65) Prior Publication Data
US 2007/0049234 A1    Mar. 1, 2007

(51) Int. Cl.
*H04B 1/16* (2006.01)
(52) U.S. Cl. .................. 455/230; 455/313; 455/318; 455/232.1; 455/245.2; 375/344; 375/345
(58) Field of Classification Search ............... 455/230, 455/313, 318, 232.1, 192.1, 245.2; 375/344, 375/345
See application file for complete search history.

(56) References Cited

U.S. PATENT DOCUMENTS

| | | | | |
|---|---|---|---|---|
| 4,017,798 A | * | 4/1977 | Gordy et al. | 375/332 |
| 4,285,060 A | * | 8/1981 | Cobb et al. | 375/376 |
| 2005/0195038 A1 | * | 9/2005 | Neenan et al. | 330/308 |
| 2007/0040744 A1 | * | 2/2007 | Zimmerman et al. | 342/464 |

* cited by examiner

*Primary Examiner*—Sanh D. Phu

(57) ABSTRACT

A method (700, 1100) and apparatus (300) are provided in a receiver for applying a variable gain to a received signal including a transmitted codeword in accordance with an Ultra Wideband (UWB) protocol. A first signal is generated and input to a selectable gain stage including a series of selectable 0 dB and 9 dB gain elements (302-305). The first signal includes the received signal mixed with a local oscillator signal modified according to a reference codeword. A gain value is selected from the selectable gain stage to amplify the first signal and form a second signal. An output signal is generated by combining the second signal and the modified local oscillator signal.

18 Claims, 6 Drawing Sheets

WIDEBAND VARIABLE GAIN AMPLIFIER IN AN ULTRA WIDEBAND RECEIVER

FIELD OF THE INVENTION

The present invention relates in general to Ultra Wideband (UWB) systems, including UWB receivers, and related equipment. More specifically, the present invention relates to a wideband Variable Gain Amplifier (VGA) for use in UWB receivers and related systems.

BACKGROUND OF THE INVENTION

As Ultra Wideband (UWB) communication becomes increasingly desirable for wireless devices due to its speed and capacity combined with its resilience to interference within high-frequency bands, design of certain RF modules becomes a great challenge due to the unique characteristics of the UWB signal environment. In particular, the Variable Gain Amplifier (VGA) is a common and important RF module whose design poses unique challenges in the UWB environment.

In RF interfaces associated with UWB receivers, VGA stages must meet high demands of linearity within the characteristic bandwidth which can lead to problems especially in the case of input signals having a wide dynamic range or in the case of UWB systems, a wide transmission bandwidth. Since gain and bandwidth are inversely proportional in VGAs, the greater the bandwidth, the less gain can typically be realized.

The challenges of RF signal recovery, processing, and gain adjustment in UWB systems is that, from a design standpoint, UWB signals or chips are transmitted in an environment which may have widely different characteristics between any one transmitter and any one or more receivers. Thus the input amplifier of a typical receiver must process UWB signals received within a correspondingly wide amplitude range. As noted, the VGA in a UWB receiver must possess characteristics of good linearity, optimum offset, and acceptable noise rejecting performance. The UWB signal must further be passed without significant loading or interference introduced by the amplifier through factors such as impedance mismatches and the like.

Conventional high frequency receivers typically further use one or more Intermediate Frequency (IF) down-converter stages. IF down-conversion stages lower the frequency of, or "down-convert" information signals transmitted across, for example, an air interface from transmission band frequencies, for example in the GHz band, to intermediate information signals at frequencies in lower frequency bands, for example the MHz band. In some conventional receivers, many IF stages are needed or are used with the effect of complicating design, increasing power consumption and producing additional disadvantageous consequences.

As also noted, for a conventional receiver with many IF stages between the actual RF carrier frequency and the frequency of the baseband stage, problems arise in that each IF stage or filter adds costs in the form of additional expense, additional power, additional complexity, additional circuit board real-estate, and the like to the receiver design and can degrade performance. It will be appreciated that much of the cost associated with additional IF stages can originate from the additional support circuitry associated therewith. For example, each down-conversion involves the addition of a separate local oscillator (LO) source usually including a separate phase-locked loop (pLL) and associated discrete components associated therewith. Additional circuits may also be required for input and output impedance matching.

IF conversion oriented receivers or RF stages typically suffer from serious drawbacks in the UWB environment associated with the inability to adequately control parameters such as DC offset which can arise from impedance mismatches, and the like, and can present difficulties in UWB systems by masking signal information, particularly since signal levels in UWB systems are deliberately low. Further problems arise with the use of IF stages in UWB systems in that RF interference associated with residual signals generated by the LO circuits associated with each IF stage, including the LO signals themselves, can be introduced into the signal path and can be amplified along with the signal or can prevent accurate signal recovery.

One solution to the problems associated with use of IF conversion in UWB systems includes using direct conversion receivers. Direct conversion receivers perform high speed conversion of the input signals "directly" from transmission band or a band close to the transmission band. However, even with the use of direct conversion techniques, DC offset can still be a problem particularly when passed through the signal path to high speed analog to digital converters. In addition to DC offset, gain setting must be accomplished with speed and precision prior to conversion further adding to the challenges of signal recovery. Thus, it will be appreciated that an RF processing circuit is needed for removing DC offset and for performing gain adjustment in UWB receivers.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

Figure 1:
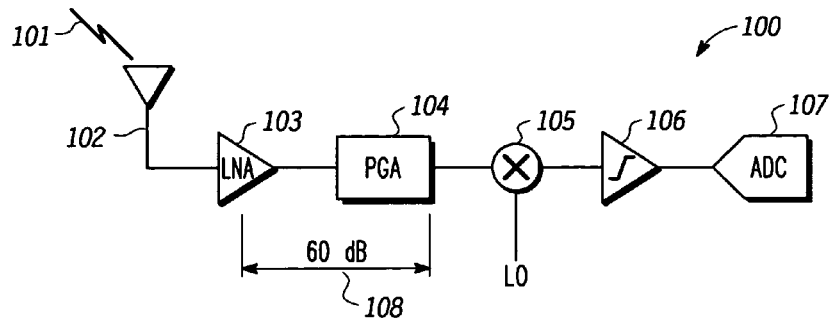
FIG. 1 is a block diagram illustrating blocks associated with an exemplary Ultra Wideband (UWB) receiver in a typical UWB environment.

The present invention provides a Variable Gain Amplifier (VGA) having a bandpass element with fast settling time and selectable gain stages for use in Ultra Wideband (UWB) receivers. In accordance with various exemplary embodiments, a receiver can be configured to apply a variable gain to a received signal using, for example, a wideband Variable Gain Amplifier (VGA). The received signal can include a transmitted codeword in accordance with a UWB protocol, such as a protocol in accordance with Institute of Electrical and Electronic Engineering (IEEE) 802.15.3(a) standard.

Accordingly, a first signal can be generated and input to a variable gain stage associated with the receiver. The first signal input includes the received signal mixed with a local oscillator signal modified, inverted, flipped, or the like according to a reference codeword. A gain value can be selected from a selectable gain stage so as to amplify the first signal input to form a second signal input which can be combined with the modified local oscillator signal. The selectable gain stage can include a bandpass filter stage from which the gain value can be selected by filtering the first input signal with a bandpass stage. Filtering procedures can include setting a frequency response associated with the bandpass stage to a desired parameter, simultaneously changing the frequency response and the gain value to a different frequency response and a different gain value in order to allow rapid settling when selecting the gain value. After settling, the frequency response can be returned from the changed frequency response to the desired parameter when the bandpass stage is settled at the changed gain value. It will be appreciated that the selectable gain stage can include a plurality of selectable gain stages each having a respective bandpass filter stage one of which can be selected. The first input signal can be filtered a bandpass stage associated with the selected selectable gain stage by setting a frequency response associated with the bandpass stage to a desired parameter, and, as above, simultaneously changing the frequency response and the gain value to a different frequency response and a different gain value to allow rapid settling. The frequency response is returned to the desired parameter when the stage is settled at the changed gain value. It should be noted that the selectable gain stage includes a 0 dB gain value and a 9 dB gain value.

In accordance with various exemplary embodiments, the present invention can be implemented in an apparatus for applying a variable gain to a received signal, using, for example, a VGA. The received signal includes a codeword transmitted in accordance with an UWB protocol such as in accordance with the IEEE 802.15.3(a) standard as noted above. The exemplary apparatus includes an RF interface, and a VGA circuit coupled thereto. The VGA circuit can include a bandpass stage and a selectable gain stage coupled thereto and can be configured to select a gain value of the selectable gain stage, set a frequency response associated with the bandpass stage to a desired parameter, simultaneously change the frequency response and the gain value of the bandpass stage to allow rapid settling, and return the frequency response to the desired parameter when the bandpass stage is settled at the changed gain value.

The VGA circuit is further configured to generate a first signal input to the bandpass stage and the selectable gain stage. The first signal input includes the received signal mixed with a local oscillator signal modified according to a reference codeword. A gain value can be selected from the selectable gain stage selectable between one of 0 dB and 9 dB as can be generated, for example, in a current mirror circuit, to amplify the first signal. An output signal can be generated by combining the second signal input and the local oscillator signal modified according to the reference codeword. It will further be appreciated that the bandpass stage includes an operational amplifier circuit having a switchable feedback quantity such as a resistance to control factors including the settling time of the bandpass stage. Another operational amplifier circuit can be configured with a switchable resistance for the selecting the gain value.

Figure 2:
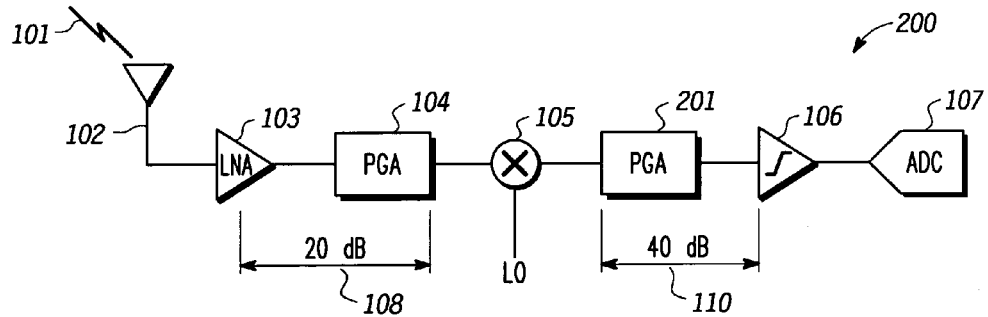
FIG. 2 is a block diagram further illustrating exemplary components in an exemplary receiver in a typical UWB environment.

A series of stages in a conventional receiver environment 100 is shown in FIG. 1. As will be appreciated by those of ordinary skill in the art, a received signal 101 transmitted over an air interface in an exemplary UWB environment, can be received using an antenna 102 and a low noise amplifier (LNA) 103 as will be appreciated by one of ordinary skill in the art. A programmable gain amplifier 104 can further be used for signal amplification such that between reception and input to a mixer 105, a typical total gain value of a 60 dB gain 108 can be applied prior to mixing. The mixer 105 can further mix the amplified received signal with a Local Oscillator (LO) signal for facilitating recovering signal information at baseband frequencies. The output of the mixer 105 can be input to an integrator 106 for further processing and the resulting output of the integrator 106 can be input to an Analog to Digital Converter (ADC) 107. It will be appreciated that in the conventional receiver environment, non-linearities, offsets, and the like can be introduced particularly because amplification is performed prior to, for example mixing in the mixer 105. Some improvements to these and other disadvantages of the configuration shown in FIG. 1, using a modified conventional receiver environment 200 as shown in FIG. 2, where a portion of amplification in accordance with, for example, a second PGA 201, can be used after mixing and can reduce some of the disadvantageous effects of DC offset, non-linearity and the like. The 60 dB gain 108 applied to the received signal 101 in the LNA 103 and the PGA 104 can be reduced to 20 dB, and the second PGA 201 can be used after the mixer 105 to apply the balance of the typical 60 dB gain value by applying a 40 dB gain value 110 prior to input of the received signal to the integrator 106. While the addition of the second PGA 201 can reduce undesirable signal parameters such as offset and the like, some of these parameters persist.

Figure 3:
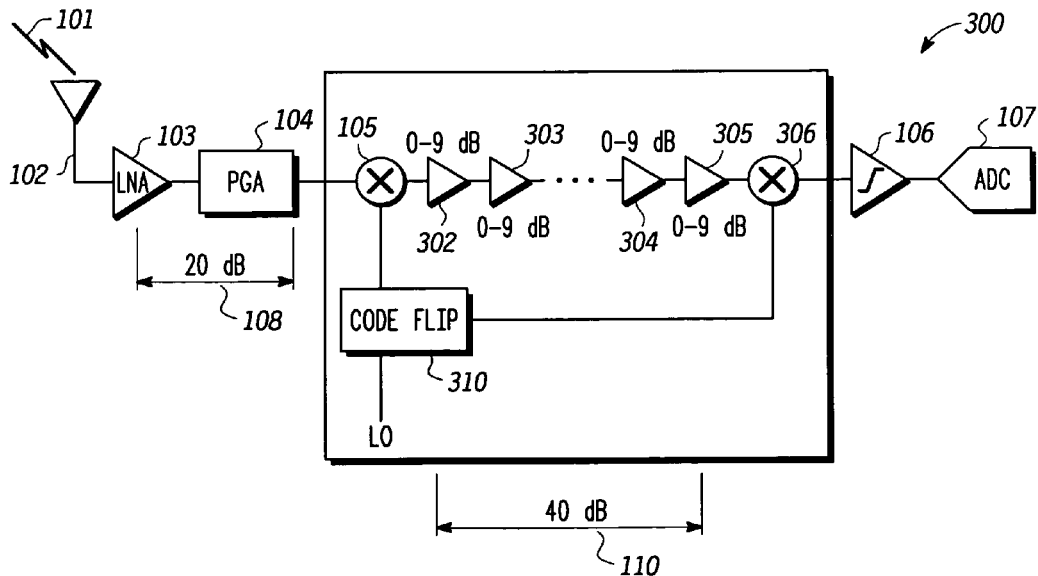
FIG. 3 is a schematic diagram illustrating exemplary components of a wideband Variable gain amplifier (VGA) apparatus in accordance with various exemplary embodiments.

To address the persistence of undesirable parameters, a wideband Variable Gain Amplifier 300 can be used to provide gain adjustment on the received signal 101 after the PGA 104 as shown in FIG. 3. The mixer 105 can be used as noted above to receive the amplified signal from the PGA 104 which can be programmed to add, for example, a 20 dB gain 108, and to apply a modified local oscillator (LO) signal thereto. It will be appreciated that the received signal is typically at a frequency of around 3.25 GHz. The modified LO signal can be formed in a CODE FLIp unit 310 as will be described in greater detail herein, to generate a modified LO signal such as a LO codeword, a portion, such as a 50% portion of which can be inverted. The partially inverted LO codeword can be input to the mixer 105 and the resulting signal can be input to the series of selectable gain elements such as a selectable gain element 302, a selectable gain element 303, a selectable gain element 304, and a selectable gain element 305. Each of the selectable gain elements 302-305 can select between, for example, a 0 dB gain value or a 9 dB gain value as will also be described in greater detail herein to form up to a 40 dB gain prior to input to the integrator 106. Each of the selectable gain elements 302-305 can include a bandpass element which can be set to a passband value of between around 1 MHz to around 1 GHz. As noted above, in conventional IF conversion receivers, the conversion from the 3.25 GHz value to baseband in the 110 MHz range is impractical and generates undesirable parameters such as DC offset. Thus an exemplary receiver in accordance with various embodiments is configured as, for example, a direct conversion receiver.

Figure 4:
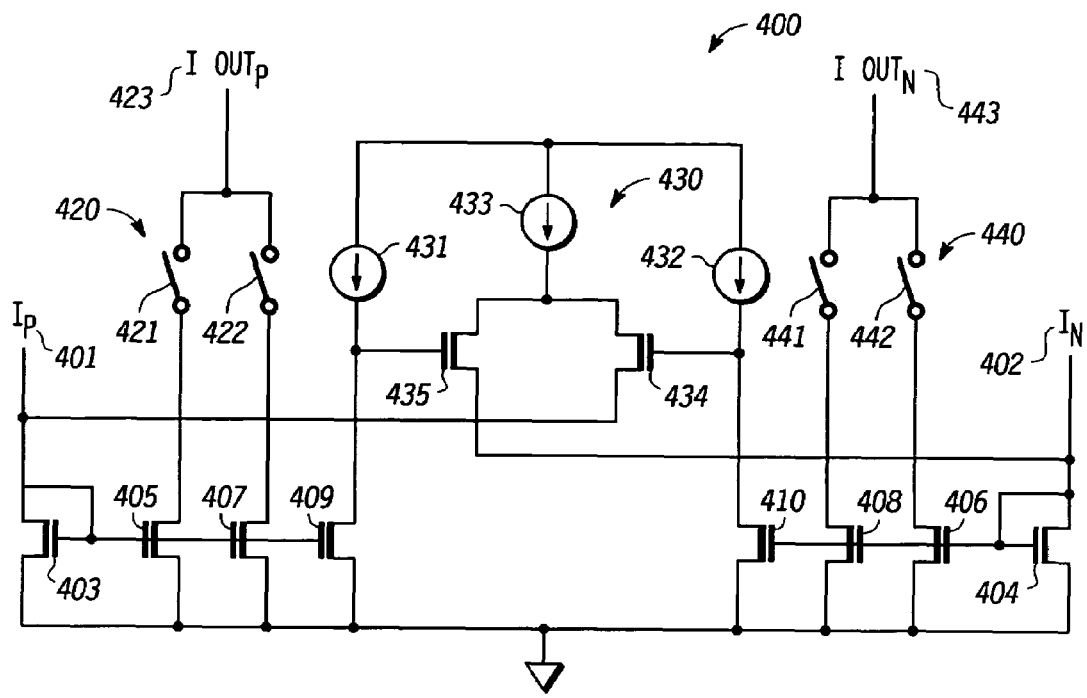
FIG. 4 is a diagram illustrating exemplary components of a current mirror circuit for the wideband VGA circuit of FIG. 3 in accordance with various exemplary embodiments.

Each of the selectable gain stages such as the selectable gain elements 302-305 can include a current mirror circuit 400 as shown in FIG. 4. As the partially inverted LO codeword is combined with the signal which, while not shown for simplicity, will be understood by one of skill in the art as being separated into a split received signal path corresponding to, for example, an I and Q component of the received signal, or the like.

Thus, a positive current component $I_P$ 401 of the positive pulse component is input to a terminal of a transistor 403 and a transistor 434 of a current generator circuit 430 containing a constant current source 431, a constant current source 432, and a constant current source 433. Similarly, a negative current component $I_N$ 402 of the negative pulse component is input to a terminal of a transistor 404 and a transistor 435 of the current generator circuit 430. When the positive current component $I_P$ 401 of the positive pulse component is active, then depending on the configuration of a switch 420, a selectable gain value can be applied to an output I $OUT_P$ 423 in the form of a current gain.

It will be appreciated that the gain value applied to the output I $OUT_P$ 423 is selectable through the application of a selection switch 421 and a selection switch 422, which will selectively apply a 0 dB gain or a 9 dB gain value depending on the switch configuration of the switch 420. For example, if neither of the selection switch 421 and the selection switch 422 is closed, no output will be generated. If one of the selection switch 421 and the selection switch 422 is closed, then the 0 dB gain value will be applied to the output I $OUT_P$ 423, and if both of the selection switch 421 and the selection switch 422 are closed, then the 9 dB gain value will be applied to the output I $OUT_P$ 423.

Similarly, for example when the negative current component $I_N$ 402 of the negative pulse component is active, then depending on the configuration of a switch 440, a selectable gain value can be applied to an output I $OUT_N$ 443 in the form of a current gain. The gain value applied to the output I $OUT_N$ 443 is selectable through the application of a selection switch 441 and a selection switch 442, which will selectively apply a 0 dB gain or a 9 dB gain value depending on the switch configuration of the switch 440. For example, if neither of the selection switch 441 and the selection switch 442 is closed, no output will be generated. If one of the selection switch 441 and the selection switch 442 is closed, then the 0 dB gain value will be applied to the output I $OUT_N$ 443, and if both of the selection switch 441 and the selection switch 442 are closed, then the 9 dB gain value will be applied to the output I $OUT_N$ 443.

Figure 5:
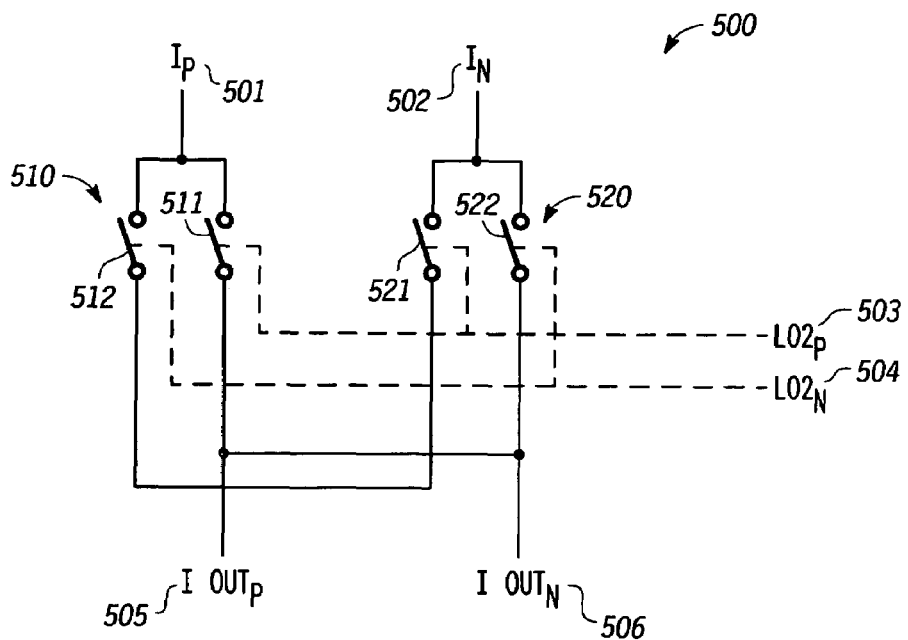
FIG. 5 is a diagram further illustrating exemplary switching components of a current mirror circuit for the wideband VGA circuit of FIG. 3 in accordance with various exemplary and alternative exemplary embodiments.

A more detailed view of an exemplary switching arrangement 500 is shown in FIG. 5. As described above, for example in connection with FIG. 4, an input signal $I_P$ 501 and an input signal $I_N$ 502, which can correspond generally to the input signals $I_P$ 401 and $I_N$ 402, may further be input to a switch 510 and a switch 520. The switch 510 has a switching element 511 and a switching element 512 and the switch 520 has a switching element 521 and a switching element 522. Depending on the flipped state of a LO signal such as a $LO2_P$ signal 503 and a $LO2_N$ signal 504, the switching element 511 and the switching element 521 can be activated during for example the active state for the $LO2_P$ signal 503 generating a corresponding output value for an output $OUT_P$ 505 and an output I $OUT_N$ 506. The switching element 512 and the switching element 522 can be activated during, for example, the active state for the $LO2_N$ signal 504, generating a corresponding output value for the output I $OUT_P$ 505 and the output I $OUT_N$ 506. The resulting outputs will be a composite of the input signals $I_P$ 501 and $I_N$ 502 during corresponding intervals of the $LO2_P$ signal 503 and the $LO2_N$ signal 504 as will be described for example, in connection with FIG. 6.

Figure 6:
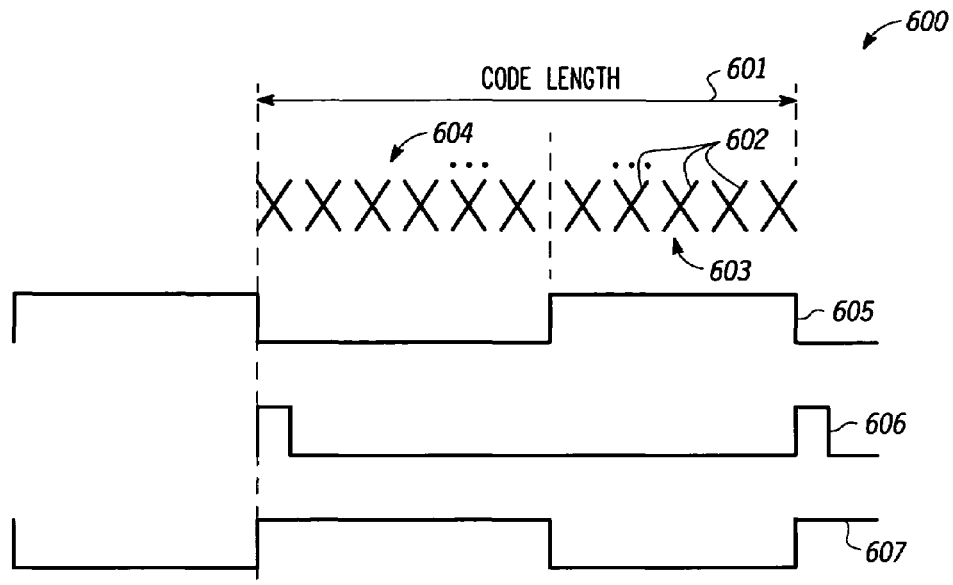
FIG. 6 is a diagram illustrating exemplary correspondence between a received codeword and signals in accordance with various exemplary embodiments.

An exemplary code flipping scenario 600 is shown in FIG. 6, where a signal 605 and a signal 607 can represent LO signals such as the $LO2_P$ signal 503 and the $LO2_N$ signal 504, as described above. A signal 606 can represent a clock interval, symbol interval, code interval or the like. Assuming the code length is represented by a code length 601, a codeword such as a codeword 603 can be broken into a first portion 602 and a second portion 604. One of the first portion 602 or the second portion 604 can be inverted with respect to the other during receive processing, such as a passband filtering and gain application as will be described, such that DC bias levels are cancelled as will be appreciated by one of ordinary skill. The percentage relationship between the first portion 602 and the entire code length 601 and the second portion 604 and the entire code length 601, in accordance with various exemplary embodiments, is 50%, although it is conceivable that other proportions may be used in slightly differing scenarios without departing from the scope of the invention. In other words the first portion 602 and the second portion 604 are roughly the same length.

Figure 7:
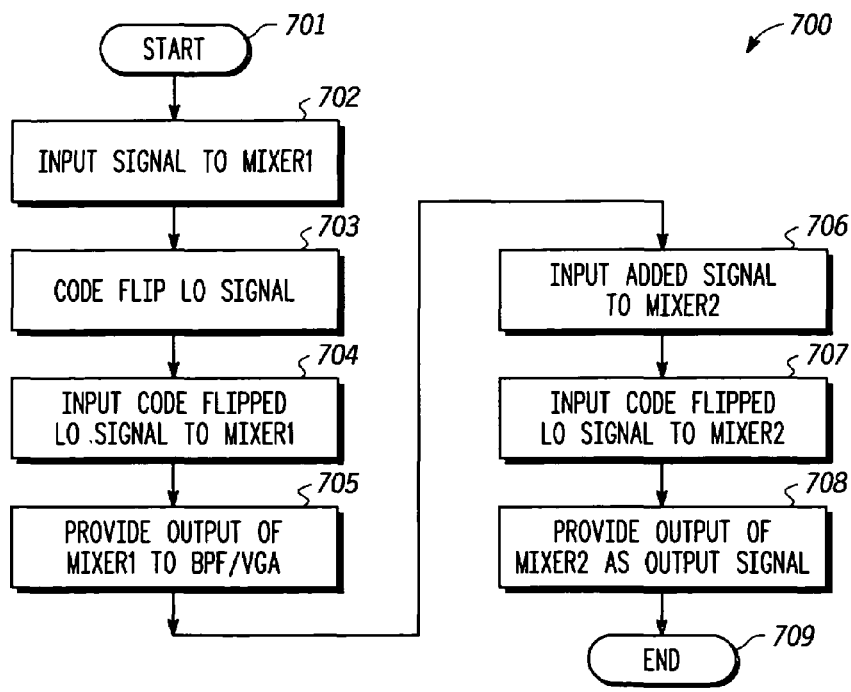
FIG. 7 is a flow chart illustrating exemplary procedures associated with the wideband VGA in accordance with various exemplary embodiments.

An exemplary procedure 700 for code flipping is shown in FIG. 7. After start at 701, which could represent the start of processing of a received signal, information frame, codeword, or the like, the received signal can be input to a first mixer such as a MIXER1 at 702. A code flipped version of the LO signal can be generated at 703 and input to the MIXER1 at 704. The output of the MIXER1 can be provided to the bandpass stage and the variable gain stage at 705 where operations can be performed as described above, to add, for example, selectable gain values to the received signal or various components thereof such as positive and negative pulse components. The gain added signal, which due to the selectable gain can in some instances include no added gain, can be input to a MIXER2 at 706. The code flipped signal can also be input to the MIXER 2 at 707 such that a combined signal is generated including the gain added received signal previously combined with the code flipped LO signal and the code flipped LO signal or a version thereof. The combined signal, which will have reduced noise and DC offset can be generated as an output signal at 708. The output signal as will be appreciated can be input into, for example a conversion stage such as an Analog to Digital conversion stage, not shown or described for simplicity. Although the exemplary procedure is shown as ending at 709, it will be appreciated that the procedure can be applied to all received signals on a repetitive or iterative basis.

Figure 8:
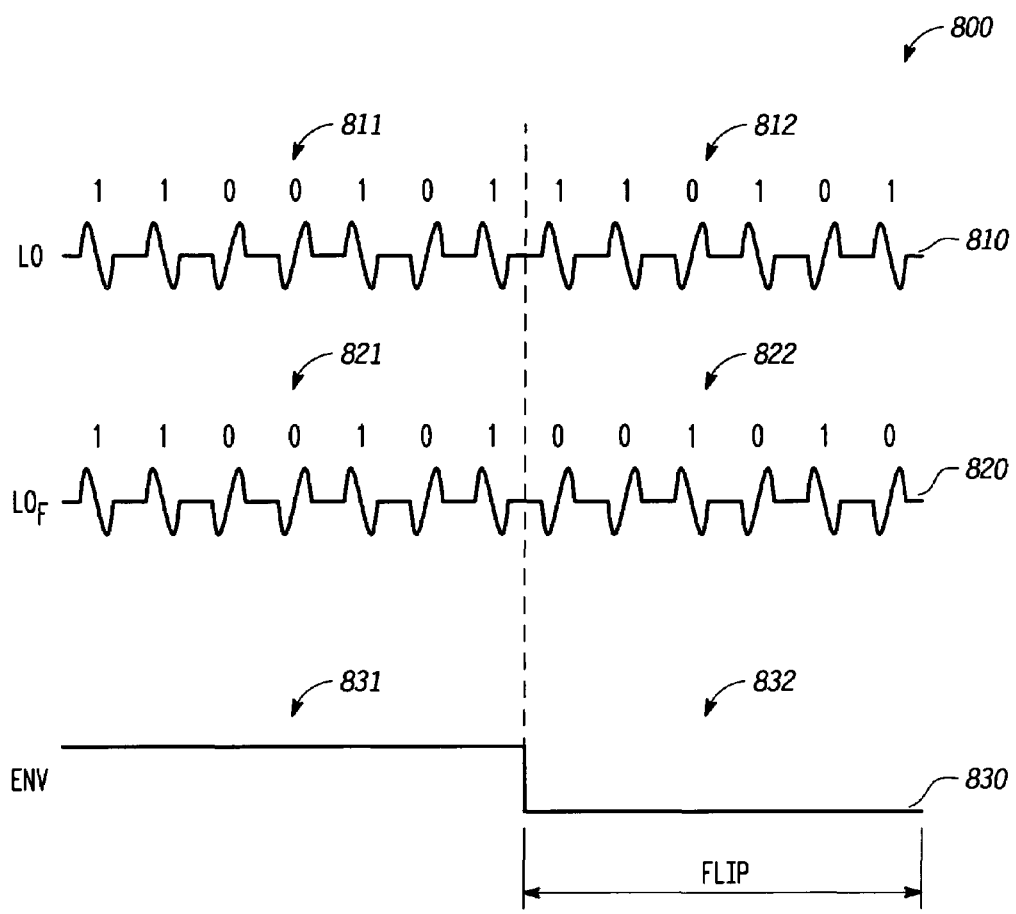
FIG. 8 is a diagram illustrating an exemplary received codeword and partial inversion thereof using a code flip signal in accordance with various exemplary embodiments.

A more detailed illustration of exemplary code flip scenario 800 is shown in FIG. 8. Therein, an exemplary LO signal 810, an exemplary inverted or code flipped LO signal 820, and an exemplary flip state signal or ENV signal 830 are shown. The exemplary LO signal 810 can consist of a first portion 811 and a second portion 812 having coded wavelets, that is, signals indicating a logical "1" or a "0" or a "1" or a "−1" or the like as will be appreciated, depending on for example the phase of the wavelet. The ratio of the first portion 811 and the second portion 812 is 1:1 such that the portions are each 50% of the entire codeword length. It can be seen that the code flipped LO signal 820 can also contain a first portion 821 and a second portion 822. However in the code flipped LO signal 820, the second portion 821 is flipped compared the LO signal 810. processing the received signal by mixing with the LO signal 810 and the code flipped LO signal 820 will cause DC components in the received signal to be cancelled and will further cancel and thus reduce noise levels in the received signal allowing for more precise conversion and variable gain control and the like. It will further be appreciated that by combining the LO signal and the received signal a resulting signal will attain at or near an RMS value as compared to, for example, the original received signal amplitude, such as the positive or negative pulse component amplitude or the like. Further, an ENV signal 830 can contain a normal level portion 831 and a flipped level portion 832 which can be generated or otherwise used as an indication that the code flip state is active such as in the selectable gain elements as described herein above.

Figure 9:
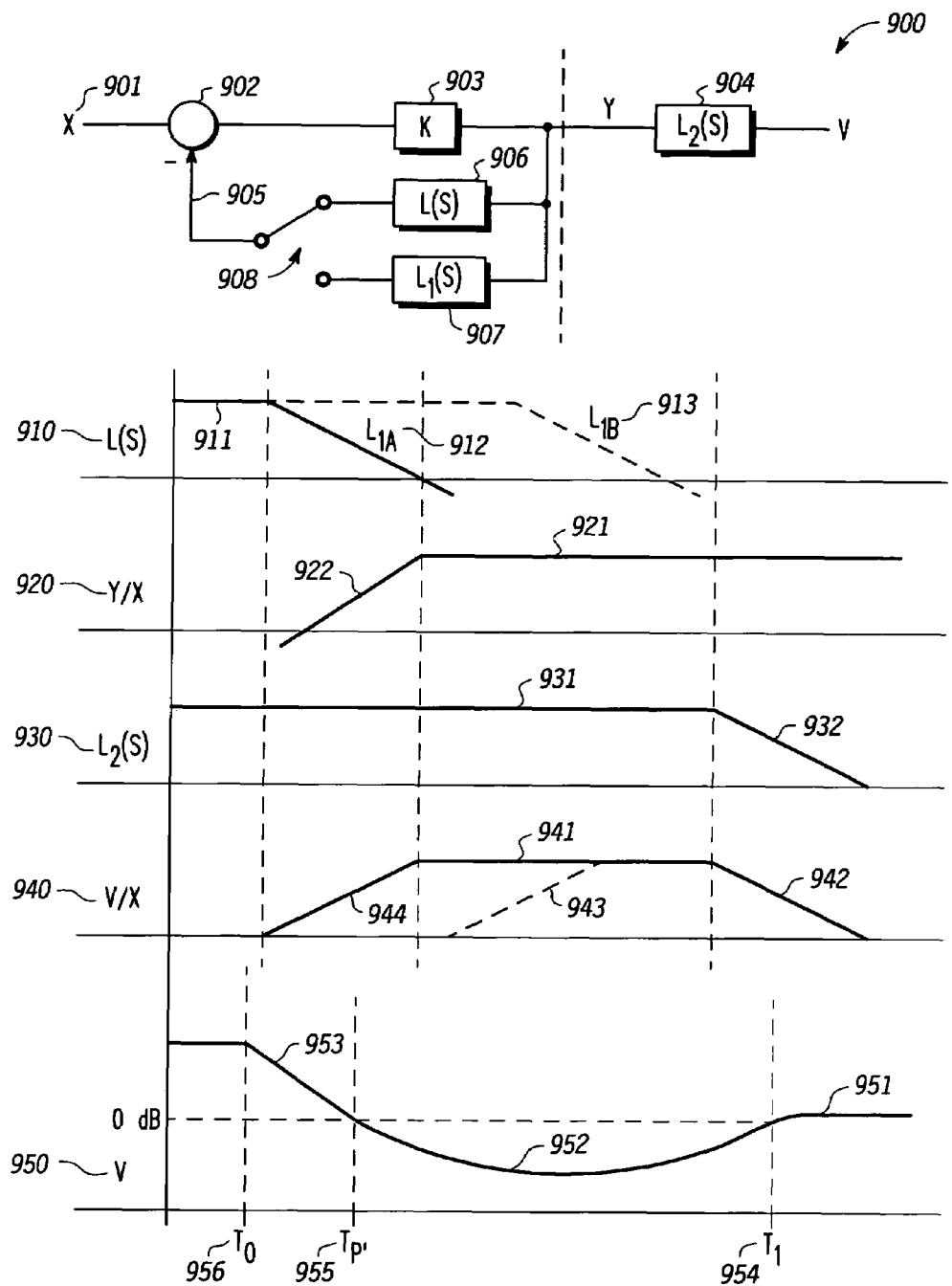
FIG. 9 is a schematic diagram and corresponding graphs illustrating an exemplary wideband VGA circuit in accordance with various exemplary embodiments.

Further in accordance with various exemplary embodiments, when activating any of the selectable gain elements, either by changing from 0 dB to 9 dB or from 9 dB to 0 dB, improvements to the operation of the bandpass features of the selectable gain stages can be accomplished using selectable bandpass elements in scenario 900 as shown in FIG. 9. An input signal X 901 can be input to a summer node 902 where feedback from an integrator, such as, for example, one of two high-gain, lowpass filters L(S) 906 or $L_1(S)$ 907 selectable with a switch 908, can be applied to the input signal X 901 prior to input to a transfer element such as a constant gain element K 903. The feeback loop established with the selected one of one of the two high-gain, lowpass filters L(S) 906 or $L_1(S)$ 907 and the constant gain element K 903, generates a highpass frequency characteristic as shown for example in a graph 920. It will be appreciated that during normal operation, the first lowpass filter L(S) 906 can be used in connection with the constant gain element K 903 to generate an output value Y. A more detailed illustration of the frequency characteristic of the lowpass stages is seen in a graph 910. During switching selectable gain values, such as from 0 dB to 9 dB and from 9 dB to 0 dB as described hereinabove, the second lowpass filter $L_1(S)$ 907 can be switched into the circuit and during a first switching interval the lowpass region 911 can have a first dropoff region $L_{1A}$ 912 such as before selectable gain switching, and a second dropoff region $L_{1B}$ 913 during a second switching interval such as after selectable gain switching. The frequency characteristic of the constant gain element K 903 in combination with other filter elements, as noted generates a highpass transfer characteristic, which is illustrated by the highpass graph 920, having a low frequency dropoff region 922 and a passband region 921. The output from the highpass circuit, for example, signal Y, can be input to a second lowpass element $L_2(S)$ 904 forming a bandpass characteristic with a higher cutoff frequency as shown in a graph 930 having a passband region 931 and a high frequency dropoff region 932. The output of the second lowpass element $L_2(S)$ 904, V, as compared to input value X is shown in a graph 940, and it can be seen that a low frequency dropoff region 943 and a low frequency dropoff region 944 corresponding, for example, to the first dropoff region $L_{1A}$ 912 such as before selectable gain switching, and the second dropoff region $L_{1B}$ 913 such as after selectable gain switching.

A graph 950 shows the signal level associated with, for example, the output of the second lowpass element $L_2(S)$ 904 at various times before during and after switching in or out selectable gain elements. The graph 950, for illustrative purposes shows a transition from 9 dB to 0 dB, but one of ordinary skill in the art will understand the implications of the graph 950 in connection with switching from a gain level of 9 dB to 0 dB. At a time $T_0$ 956, such as during the first switching interval before selectable gain switching, the signal level drops off at a region 953 until a time $T_F$ 955 corresponding to, for example, a second switching interval after selectable gain switching where the signal level can drop below 0 dB at a region 952. At a time $T_1$ 954, the signal level can settle at 0 dB at a region 951.

Figure 10:
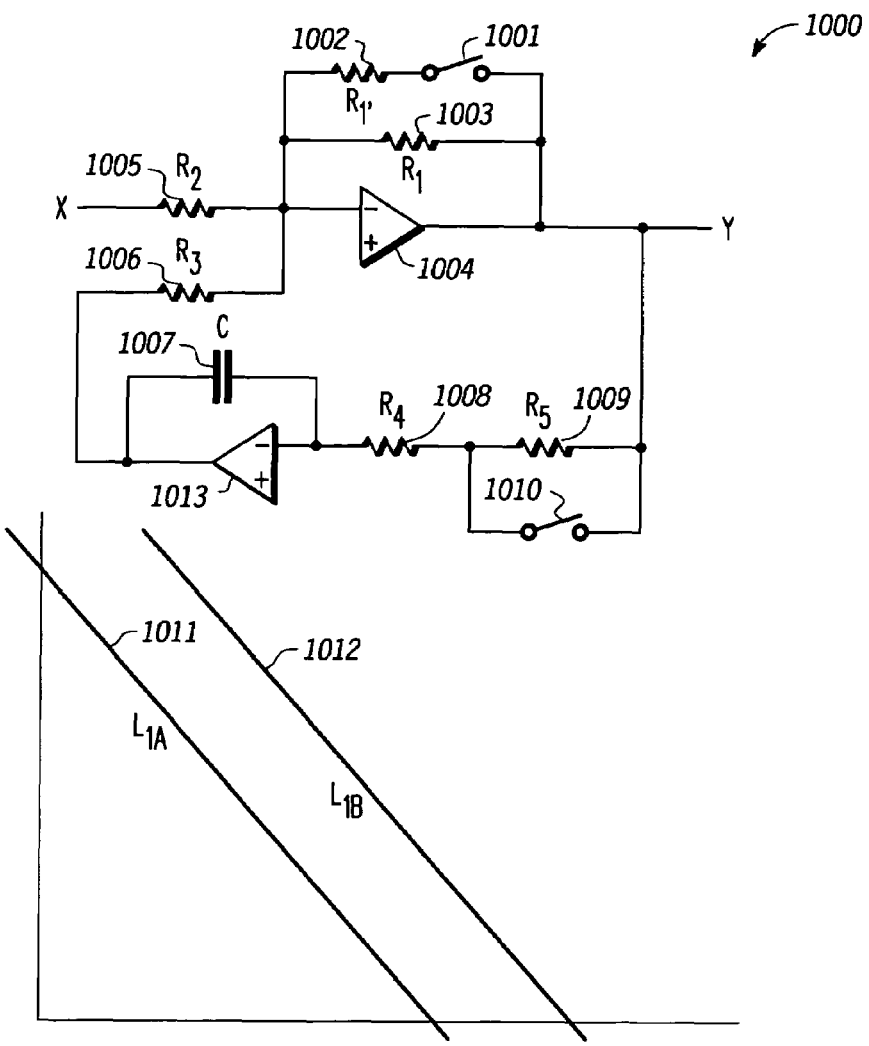
FIG. 10 is a circuit diagram and corresponding graphs further illustrating an exemplary wideband VGA circuit in accordance with various exemplary embodiments.

To further illustrate the operation of exemplary bandpass features of selectable gain elements in accordance with various exemplary embodiments an exemplary scenario 1000 is shown in FIG. 10 including a circuit diagram and graph. An input X can be applied to an exemplary bandpass circuit having a first operational amplifier 1004 and a second operational amplifier 1013. The exemplary circuit includes a switchable resistance feedback network including a switch 1001, a switchable parallel resistance $R_{1'}$ 1002, a fixed feedback resistance $R_1$ 1003, and an input resistance R2 1005. An active feedback network can be formed using the second operational amplifier 1013 having a feedback capacitance 1007 to facilitate the control of frequency response and a second switchable resistance network including a switch 1010, a switchable series resistance R5 1009, a fixed series resistance R4 1008. With reference to the exemplary graph, it will be appreciated that during normal operation corresponding to a settling characteristic $L_{1A}$ 1011, for example, when slow settling is acceptable such as before selectable gain switching, the switchable series resistance R5 1009 is in circuit or switched in circuit by operation of the switch 1010, and the switchable parallel resistance $R_{1'}$ 1002 is out of circuit or switched out of circuit by operation of the switch 1001. When fast settling is required corresponding to a settling characteristic $L_{1B}$ 1012, such as after selectable gain switching, the switchable series resistance R5 1009 is out of circuit or switched out of circuit by operation of the switch 1010, and the switchable parallel resistance $R_{1'}$ 1002 is in circuit or switched in circuit by operation of the switch 1001.

Figure 11:
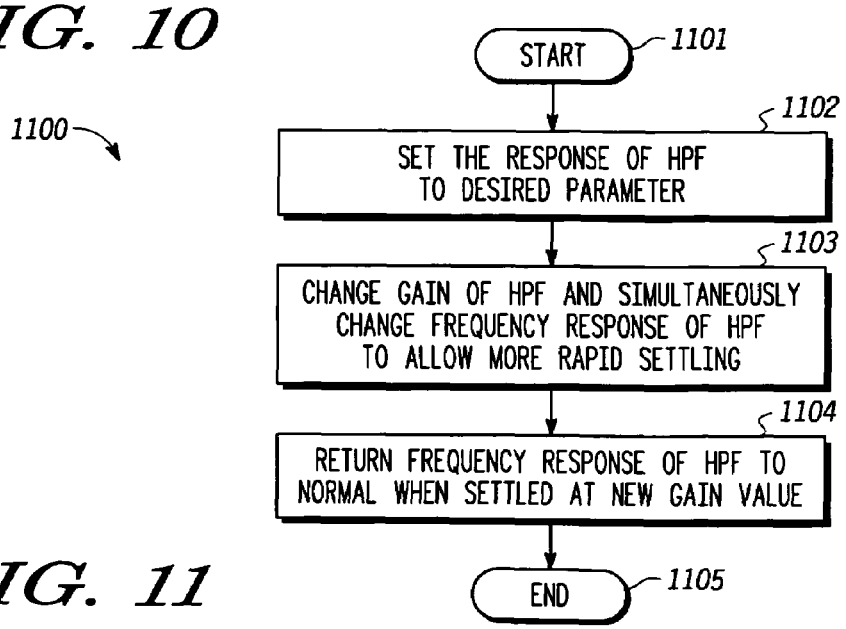
FIG. 11 is a flow chart illustrating exemplary procedures associated with operation of the exemplary wideband VGA in accordance with various exemplary embodiments.

The operation of the exemplary bandpass features of selectable gain elements in accordance with various exemplary embodiments can be summarized according to the exemplary procedure 1100 as shown in FIG. 11. After start at 701, such as when a signal such as a UWB signal, information signal or the like is received, the response of the highpass element can be set to a desired parameter at 1102 such as before switching a selectable gain element. After switching the selectable gain element, such as at 1103, the gain of the highpass element and the frequency response of the highpass element can be changed, for example as described hereinabove with regard to FIG. 9 and FIG. 10, to allow for more rapid settling. When settled at the new gain value, the normal frequency response of the highpass element can be restored at 1104. Although the exemplary procedure is indicated as ending at 1105, it will be appreciated that the exemplary procedure can be repeated to can loop so as to continue processing subsequent received signals or the like.

Although this disclosure discusses a UWB device using the IEEE 802.15.3a standard by way of example, the general design is also applicable to other wireless networks, and should not be considered to be limited to application with respect to IEEE 802.15.3a networks. It should further be noted that while the present invention is applicable to VGA in a UWB receiver device which operates at different speeds and in different modes, the present invention should not be limited to any particular type of VGA operation, but can be used in any VGA situation for which its features would be advantageous.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method in a receiver for applying a variable gain to a received signal including a transmitted codeword in accordance with an Ultra Wideband (UWB) protocol, the method comprising:

generating a first signal input to a selectable gain stage associated with the receiver, the first signal input including the received signal mixed with a local oscillator signal modified according to a reference codeword;

selecting a gain value from the selectable gain stage so as to amplify the first signal input to form a second signal input; and generating an output signal by combining the second signal input and the local oscillator signal modified according to the reference codeword.

2. A method, as recited in claim 1, wherein:

the selectable gain stage includes a bandpass filter stage; and the selecting the gain value from the selectable gain stage includes filtering the first input signal with a bandpass stage, the filtering including:

setting a frequency response associated with the bandpass stage to a desired parameter;

simultaneously changing the frequency response and the gain value of the bandpass stage to a changed frequency response and a changed gain value so as to allow rapid settling when the selecting the gain value is performed; and returning the frequency response from the changed frequency response to the desired parameter when the bandpass stage is settled at the changed gain value.

3. A method, as recited in claim 1, wherein:

the selectable gain stage includes a plurality of selectable gain stages each having a respective bandpass filter stage; and the selecting the gain value from the selectable gain stage includes selecting one of the plurality of selectable gain stages to form a selected one and filtering the first input signal with the respective bandpass stage associated with the selected one, the filtering including:

setting a frequency response associated with the respective bandpass stage to a desired parameter;

simultaneously changing the frequency response and the gain value of the respective bandpass stage to a changed frequency response and a changed gain value so as to allow rapid settling when the selecting the gain value is performed; and returning the frequency response from the changed frequency response to the desired parameter when the respective bandpass stage is settled at the changed gain value.

4. A method, as recited in claim 1, wherein a portion of the reference codeword is inverted, the reference codeword associated with the transmitted codeword.

5. A method, as recited in claim 1, wherein a 50% portion of the reference codeword is inverted, the reference codeword associated with the transmitted codeword.

6. A method, as recited in claim 1, wherein the UWB protocol includes a protocol in accordance with the Institute of Electrical and Electronic Engineering (IEEE) 802.15.3(a) specification.

7. A method as recited in claim 1, wherein:

the selectable gain stage includes a 0 dB gain value and a 9 dB gain value; and the selecting a gain value from the selectable gain stage includes selecting one of the 0 dB gain value and the 9 dB gain value.

8. A method in a direct conversion receiver for applying a variable gain to a received signal including a transmitted codeword in accordance with an Ultra Wideband (UWB) protocol on a signal path in the direct conversion receiver, the method comprising:

selecting a gain value of a Variable Gain Amplifier (VGA) associated with the direct conversion receiver and the variable gain;

setting a frequency response associated with a bandpass stage in the VGA to a desired parameter;

simultaneously changing the frequency response and the gain value of the bandpass stage to a changed frequency response and a changed gain value so as to allow rapid settling when the selecting the gain value is performed; and returning the frequency response from the changed frequency response to the desired parameter when the bandpass stage is settled at the changed gain value.

9. A method, as recited in claim 8, further comprising:

mixing the received signal including the transmitted codeword with a local oscillator signal including a reference codeword at a first point on the signal path before the VGA; and mixing the local oscillator signal including the reference codeword with an amplified signal output from the VGA at a second point on the signal path after the VGA, wherein a 50% portion the reference codeword is inverted.

10. A method, as recited in claim 8, wherein VGA includes a plurality of selectable gain stages and wherein the selecting the gain value from the VGA includes selecting one of the plurality of selectable gain stages.

11. A method as recited in claim 10, wherein:

each of the plurality of selectable gain stage includes a 0 dB gain value and a 9 dB gain value; and the selecting the one of the plurality of selectable gain stages includes selecting one of the 0 dB gain value and the 9 dB gain values.

12. A method, as recited in claim 8, wherein the UWB protocol includes a protocol in accordance with the Institute of Electrical and Electronic Engineering (IEEE) 802.15.3(a) specification.

13. An apparatus for applying a variable gain to a received signal including a codeword in accordance with an Ultra Wideband (UWB) protocol, the apparatus comprising:

an RF interface; and a Variable gain amplifier (VGA) circuit coupled to the RF interface, the VGA circuit including:
- a bandpass stage; and
- a selectable gain stage coupled to the bandpass stage, wherein the VGA circuit is configured to:
- select a gain value of the selectable gain stage to form a selected gain;
- set a frequency response associated with the bandpass stage to a desired parameter;
- simultaneously change the frequency response and the gain value of the bandpass stage to a changed frequency response and a changed gain value so as to allow rapid settling when the selecting the gain value is performed; and
- return the frequency response from the changed frequency response to the desired parameter when the bandpass stage is settled at the changed gain value.

14. An apparatus, as recited in claim 13, wherein the VGA circuit is further configured to:
- generate a first signal input to the bandpass stage and the selectable gain stage, the first signal input including the received signal mixed with a local oscillator signal modified according to a reference codeword;
- select a gain value from the selectable gain stage so as to amplify the first signal input to form a second signal input; and
- generate an output signal by combining the second signal input and the local oscillator signal modified according to the reference codeword.

15. An apparatus, as recited in claim 13, wherein the selectable gain stage includes a plurality of selectable gain stages each selectable between one of 0 dB and 9 dB.

16. An apparatus, as recited in claim 13, wherein the selectable gain stage includes a current mirror circuit having a selectable output current associated with the selected gain.

17. An apparatus, as recited in claim 13, wherein the UWB protocol includes a protocol in accordance with the Institute of Electrical and Electronic Engineering (IEEE) 802.15.3(a) specification.

18. An apparatus, as recited in claim 13, wherein:
- the bandpass stage includes a first operational amplifier circuit having a first switchable feedback quantity to control a factor including the settling time of the bandpass stage; and
- the selectable gain stage includes a second operational amplifier circuit having a second switchable resistance for the selecting the gain value.

* * * * *